United States Patent [19]

Beneking

[11] 3,715,631

[45] Feb. 6, 1973

[54] RADIO-FREQUENCY LINE

[75] Inventor: Heinz Beneking, Aachen, Germany

[73] Assignee: Licentia Patent - Verwaltungs - G.m.b.H., Frankfurt am Main, Germany

[22] Filed: May 1, 1970

[21] Appl. No.: 33,581

[30] Foreign Application Priority Data

May 27, 1969 Germany ....................P 19 26 989.7

[52] U.S. Cl....317/234 R, 317/234 N, 317/235 WW, 317/235 AH, 333/84 M

[51] Int. Cl. ................................................H01l 5/06

[58] Field of Search...317/234, 235; 333/73 S, 84 M; 307/303

[56] References Cited

UNITED STATES PATENTS 3,491,273 1/1970 Stiegler ...............................317/235
3,518,494 6/1970 James..................................317/101
3,373,323 3/1968 Wolfrum et al. ....................317/235
3,145,454 8/1964 Dacey ................................29/155.5
3,577,181 5/1971 Belohoubek ..........................333/84

OTHER PUBLICATIONS

IBM (TDB) "Metal Contacts to Semiconductor Devices" Sopher and Totta, Vol. 10, No. 2, July 1967.
IBM (TDB) "Fabrication of Tunnel Diode" 1M, Vol. 6, No. 2, July 1963.

*Primary Examiner*—John W. Huckert
*Assistant Examiner*—E. Wojciechowicz
*Attorney*—Spencer & Kaye

[57] ABSTRACT

A radio-frequency line suitable for use as an electrical supply lead to semiconductor components, comprising a semiconductor body containing at least one semiconductor component and a strip line comprising a supply lead and a sink which is provided on one surface of the semiconductor body, a dielectric layer being provided between the supply lead and the sink.

12 Claims, 3 Drawing Figures

Inventor:
Heinz Beneking
BY *Spencer & Kaye*
ATTORNEYS.

RADIO-FREQUENCY LINE

BACKGROUND OF THE INVENTION

In the radio-frequency field, radio-frequency lines are needed directly on the semiconductor surface. If the conductor strips of a strip line suitable for this are applied to opposite surfaces of the semiconductor body, the strips must be made relatively wide if semiconductor bodies of conventional dimensions are selected. Since the semiconductor substrate serving as a dielectric often has a limited insulating capacity, the balancing of such lines is difficult, apart from the electrical losses which occur as a result. Furthermore, the connection of the conductor strips to specific regions of the semiconductor components at the surface of the semiconductor body remote from the semiconductor components cannot be realized without unwanted points of discontinuity, quite apart from the fact that the connection of a line to the electrical components in the semiconductor body at the surface remote from the components renders great technical expenditure necessary.

SUMMARY OF THE INVENTION

In order to avoid these disadvantages, it is the object of the present invention that both conductor strips of the strip line should be accommodated at the surface of a semiconductor body adjacent to the components, an insulating layer serving as a dielectric being disposed between the conductor strips.

Accordingly, the present invention provides a radio-frequency line suitable for use as an electrical supply lead to semiconductor components, comprising a semiconductor body, at least one semiconductor component in said semiconductor body, at least one strip line comprising a supply lead and a sink provided on one surface of said semiconductor body and a dielectric layer between the supply lead and sink.

The construction of the radio-frequency line according to the invention has the important advantage that the selection of the dielectric is independent of the particular nature and doping of the semiconductor body and very high quality dielectrics can be used. Since the dielectric for the radio-frequency line can only be constructed in the form of a very thin layer, extremely narrow conductor strips result with a predetermined characteristic impedance of the line, but these can easily be realized in the semiconductor art and occupy only a small portion of the semiconductor surface. In this manner, a plurality of strip lines can be accommodated on the semiconductor surface or, if the number of lines needed is limited, the free semiconductor surface can be used for vapor-deposited thin-film resistors for example. Since the strip line is on the surface of the semiconductor body adjacent to the semiconductor components, connection of the strips to the associated semiconductor regions is possible without difficulty through apertures in the insulating layers present on the surface of the semiconductor.

BRIEF DESCRIPTION OF THE DRAWINGS

The invention will now be further described, by way of example, with reference to the accompanying drawings, in which.

DESCRIPTION OF PREFERRED EMBODIMENTS OF THE INVENTION

In an advantageous embodiment of the radio-frequency line according to the invention, provision is made for the contacts of the semiconductor components to be connected to the leads of the radio-frequency line to be connected to conducting paths which form the leads and which extend over an insulating layer covering the semiconductor surface. This first insulating layer and the leads are covered by a further insulating layer serving as a dielectric, which in turn is covered at least partially by a metal layer serving as a sink which is electrically connected, through apertures in the two insulating layers, to the associated region or regions of the semiconductor components. Such a construction of the *rf* line is particularly suitable for semiconductor bodies which consist of silicon or germanium.

If a semiconductor body of semi-insulating gallium arsenide basic material is used for example, in which there are embedded conducting semiconductor regions containing the components, in an advantageous further development of the *rf* line according to the invention, the leads may extend directly over the surface of the semiconductor body dispensing with a first insulating layer. The semiconductor surface and the leads of the strip lines are then covered by an insulating layer which serves as a dielectric and which is covered in turn at least partially by a metal layer serving as a sink which in turn is electrically connected, through apertures in the dielectric layer, to the associated region or regions of the semiconductor components accommodated in the semiconductor body.

Silicon dioxide or silicon nitride for example are suitable as material for the insulating or dielectric layer provided on the semiconductor surface.

Figure 1:
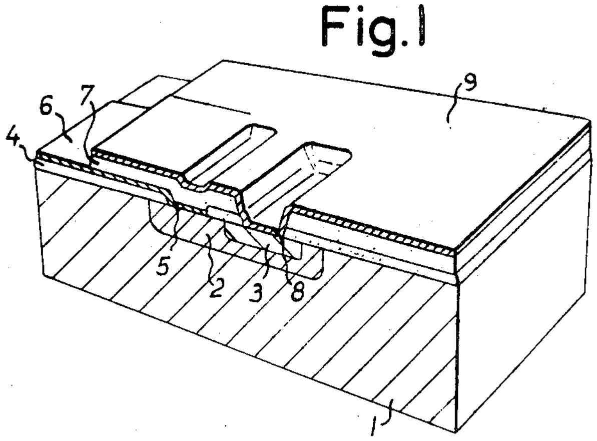
FIG. 1 shows, partially in section and partially in perspective, a first embodiment of a radio-frequency line according to the invention.

Referring now to the drawings, FIG. 1 shows a semiconductor body 1, for example of silicon of the first type of conductivity. A region 2 of the second type of conductivity is introduced into the silicon body 1 in order to form a diode and a region 3 of the first type of conductivity is in turn introduced into the region 2. The regions 2 and 3 are preferably produced by means of the known planar technique, using the masking etching and diffusion technique likewise known. A silicon dioxide layer or silicon nitride layer 4 for example serves as a masking layer. An oxide layer can easily be produced by thermal oxidation or by anodic oxidation. After the termination of all diffusion processes, contact-making windows are introduced, for example by etching, into the oxide layer 4, above the semiconductor regions 2 and 3, and said semiconductor regions are provided with metal contacts 5 and 8, which consist of gold or aluminum for example, in these windows. The contact 5 at the semiconductor region 2 is connected to a conducting path 6 which extends over the insulating layer 4 and serves as a lead for the strip line. This conducting path consists, for example, of gold, aluminum or copper and is preferably produced by means of the vapor-deposition and etching technique. The width of the conducting path depends, in accordance with known mathematical relationships, on the characteristic impedance to be realized, the material and the thickness of the dielectric.

In an example of an embodiment which has been realized, a dielectric of silicon dioxide was used to produce a radio-frequency line having a characteristic impedance of 50 ohms. With a thickness of the dielectric layer of 3$\mu$ m, calculation and experiment led to a width of the conducting path 6 of about 3$\mu$ m. With other numerical values it also proved favorable if the thickness of the dielectric layer corresponded substantially to the width of the conductor strips for the radio frequency line.

In this connection, attention may be drawn to the fact that the proportions selected in the Figures, particularly those of the strips 6 and of the dielectric layer, do not give any indication of the actual geometrical relationships but have been selected solely for reasons of optical clarity.

After the leads 6 have been produced, the dielectric layer 7, which is highly insulating and consists for example of $SiO_2$ or silicon nitride, is applied to the free portion of the oxide layer 4. An aperture which exposes the metal contact 8 is formed in this layer over the metal electrode 8 making contact with the region 3. Then a covering electrode 9, for example of gold, aluminum or copper, is vapor-deposited, chemically precipitated or electrodeposited on the dielectric layer and serves as a sink for the *rf* line. During the production of the covering electrode 9, the electrical connection between the covering electrode and the metal contact 8 on the semiconductor region 3 is formed at the same time. Thus the covering electrode 9 together with the conductor strip 6 forms a radio-frequency line having a predetermined characteristic impedance.

The covering electrode is, of course, also removed to such an extent that it extends only immediately over the conducting path 6 on the dielectric layer, or only partially covers this. If the covering electrode is used as a sink or as a ground electrode, however, such a removal is unnecessary and is generally less favorable as regards radio-frequency. If a plurality of radio-frequency lines, which are independent of one another, are to extend over the semiconductor surface, however, as may be necessary, for example, in the wiring of integrated circuits, then the metal layer present on the dielectric layer is preferably structured and divided according to the conducting paths extending over the insulating layer 4 in order to form a plurality of lines; in this case, the upper metal layer is preferably made broader than the subjacent conducting path.

Figure 2:
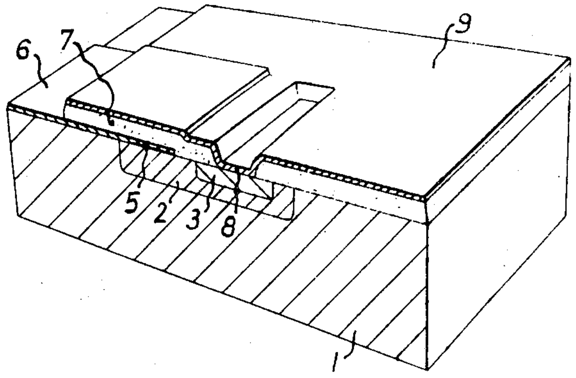
FIG. 2 shows, partially in section and partially in perspective, a second embodiment of a radio-frequency line according to the invention.

Another advantageous embodiment of the *rf* line according to the invention is illustrated in FIG. 2.

This arrangement is particularly suitable when the semiconductor body consists of a semi-insulating semiconductor body 1. Semi-insulating gallium arsenide is suitable for this for example. In FIG. 2, the connection of the diode to an *rf* line which extends over one surface of the semiconductor body is illustrated partially in section, partially in perspective. A region 2 of a specific first type of conductivity is let into the semi-insulating body 1 and in turn surrounds a region 3 of the second type of conductivity. The conductor strip 6 forming the lead of the *rf* line extends directly over the semiconductor surface. A first insulating layer such as was still used in the arrangement illustrated in FIG. 1, can be dispensed with. The free portion of the semiconductor surface and the strip lead 6 are covered by a dielectric layer 7 which, as was also described with reference to the arrangement shown in FIG. 1, is provided with a covering electrode which is electrically connected to the contact 8 on the semiconductor region 3 through an aperture in the dielectric layer 7.

Figure 3:
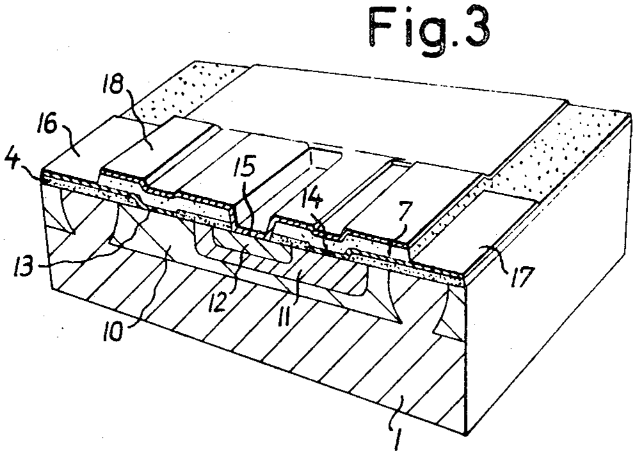
FIG. 3 shows, partially in section and partially in perspective, a third embodiment of a radio-frequency line according to the invention.

In FIG. 3, the connection of a transistor to an *rf* input and an *rf* output line is illustrated, partially in section, partially in perspective, when the emitter electrode of the transistor is common to the input and the output of the transistor quadripole. A semiconductor body 1 contains a transistor, produced by the planar technique, for example, consisting of a collector region 10, base region 11 and an emitter region 12. The collector region 10 is surrounded on all sides by semiconductor base material which has a type of conductivity opposite to the collector region, as is found, in particular, in integrated semiconductor circuits. The collector region 10 is provided at the surface of the semiconductor body common to all the regions, with a metal contact 13 which is connected to a conducting path 16 extending over the insulating layer 4. This conducting path 16 serves as a lead for the *rf* strip line. In the same manner, the base region 11 is provided with an ohmic base connecting contact 14 which is electrically connected to the base conducting path 17 extending over the insulating layer 4. The width of the base conducting path, like that of the collector conductor path, is selected so that the required characteristic impedance is obtained on the one hand for the input line and on the other hand for the output line of the transistor, if the thickness of the conducting paths 16 and 17 and the dielectric layer 7 provided on the insulating layer 4 is predetermined. As was the case with the arrangements shown in FIGS. 1 and 2*a*, covering electrode is provided on the dielectric layer 7 but is now electrically connected to the connecting contact 15 at the emitter region 12 through an aperture in the two insulating layers 4 and 7. This covering electrode is common to the input line and the output line as a sink and must therefore extend both over the base conducting path 17 and also over the collector conducting path 16.

In a corresponding manner, the connecting contacts on integrated semiconductor circuits may be provided with *rf* lines extending directly over the semiconductor surface. The *rf* line indicated is therefore suitable for diodes, transistors, integrated semiconductor circuits and other components which can be produced by means of the semiconductor technique. Attention is also drawn to the fact that the conducting paths may also be provided directly on the surface of the semiconductor in the case of germanium and silicon semiconductor bodies, particularly when provision is made for the operation of the components connected to the conducting paths only at high frequencies.

It will be understood that the above description of the present invention is susceptible to various modifications, changes and adaptations.

What is claimed is:

1. A radio-frequency line suitable for use as an electrical supply lead to semiconductor components, comprising a semiconductor body, at least one semiconductor component in said semiconductor body, said semiconductor component including at least two active semiconductor regions, with each of said regions extending to one surface of said semiconductor body and being provided, at said surface, with a respective contact, at least one strip line comprising a supply lead and a sink provided on said one surface of said semiconductor body, a dielectric layer between the supply lead and sink, said supply lead, sink and dielectric layer being formed as layers on said one surface, with said supply lead and said sink each being electrically connected to a respective contact and superimposed with respect to one another to form a high frequency line with a given characteristic impedance, and separate external connection means formed as part of each of said supply lead and said sink, each said connection means having an exposed surface for electrically connecting said supply lead and said sink to an external electrical circuit.

2. A radio-frequency line as claimed in claim 1, including two strip lines and in which conducting paths are connected to said contacts and form supply leads for said strip lines, and in which said conducting paths and said one surface of the semiconductor body are covered by said dielectric layer which forms an insulating layer and in which the dielectric layer is at least partially covered by a metal layer which serves as said sink, an aperture being provided in the dielectric layer to allow said sink to be connected to one of said contacts of said semiconductor components.

3. A radio-frequency line as claimed in claim 2, in which a further insulating layer is provided between said one surface of the semiconductor body and said conducting paths to insulate said paths from said body, said dielectric layer covering said conducting paths and said further insulating layer and apertures being provided both in the dielectric layer and said further insulating layer to allow said sink to be connected to one of the contacts of said semiconductor components.

4. A radio-frequency line as claimed in claim 2, in which the width of said conducting paths corresponds to the thickness of the dielectric layer.

5. A radio-frequency line as claimed in claim 4, in which the conducting paths are about 3$\mu$m wide and the dielectric layer is about 3$\mu$m thick.

6. A radio-frequency line as claimed in claim 1, in which the semiconductor body consists of silicon or germanium.

7. A radio-frequency line as claimed in claim 1, in which the semiconductor body consists of semi-insulating gallium arsenide.

8. A radio-frequency line as claimed in claim 1, in which the insulating layers consist of silicon dioxide or silicon nitride.

9. A radio-frequency as claimed in claim 1, in which the sink is structured and divided to form a plurality of independent lines.

10. A radio-frequency line as claimed in claim 1, in which the supply lead and sink consist of gold.

11. A radio-frequency line as claimed in claim 1, in which the supply lead and sink consist of copper.

12. A radio-frequency line as claimed in claim 1, in which the supply lead and sink consist of aluminum.

* * * * *